(12) United States Patent
Feng et al.

(10) Patent No.: US 11,678,579 B2
(45) Date of Patent: Jun. 13, 2023

(54) STRETCHABLE IONIC HYDROGEL WITH HIGH THERMOPOWER FOR LOW-GRADE HEAT HARVESTING

(71) Applicant: THE UNIVERSITY OF HONG KONG, Hong Kong (CN)

(72) Inventors: Shien-Ping Feng, Hong Kong (CN); Chang Liu, Hong Kong (CN); Qikai Li, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 0 days.

(21) Appl. No.: 17/225,468

(22) Filed: Apr. 8, 2021

(65) Prior Publication Data

US 2021/0343922 A1 Nov. 4, 2021

Related U.S. Application Data

(60) Provisional application No. 63/017,066, filed on Apr. 29, 2020.

(51) Int. Cl.
| | |
|---|---|
| *H10N 10/856* | (2023.01) |
| *C08F 251/00* | (2006.01) |
| *C08J 3/075* | (2006.01) |
| *H10N 10/01* | (2023.01) |
| *H10N 10/13* | (2023.01) |
| *H10N 10/17* | (2023.01) |

(52) U.S. Cl.
CPC ......... *H10N 10/856* (2023.02); *C08F 251/00* (2013.01); *C08J 3/075* (2013.01); *H10N 10/01* (2023.02); *H10N 10/13* (2023.02); *H10N 10/17* (2023.02)

(58) Field of Classification Search
CPC ......... H01L 35/24; H01L 35/30; H01L 35/32; H01L 35/34; C08F 251/00; C08J 3/075; C08J 2333/26; C08J 2405/04; C08J 2471/02
See application file for complete search history.

(56) References Cited

U.S. PATENT DOCUMENTS

| | | |
|---|---|---|
| 9,559,388 B2 | 1/2017 | Lee et al. |
| 2021/0013551 A1* | 1/2021 | Zhi ..................... H01M 4/0452 |

FOREIGN PATENT DOCUMENTS

| | | | |
|---|---|---|---|
| CN | 110058738 A | * 7/2019 | ............. B32B 27/08 |

OTHER PUBLICATIONS

Shao, CN-110058738-A, Machine Translation (Year: 2019).*
Poudel, B. et al. "High-thermoelectric performance of nanostructured bismuth antimony telluride bulk alloys," Science, 320, 634-638 (2008).
Kraemer, D. et al., "High-performance flat-panel solar thermoelectric generators with high thermal concentration," Nature Materials, 10, 532 (2011).

(Continued)

*Primary Examiner* — Devina Pillay
(74) *Attorney, Agent, or Firm* — Leason Ellis LLP (57) ABSTRACT

An ionic thermoelectric (i-TE) hydrogel that converts heat into electricity based on the Soret effect, and devices and methods incorporating the ionic thermoelectric hydrogel. The ionic thermoelectric hydrogel includes poly(acrylamide) crosslinked with an alginate, 1-ethyl-3-methylimidazolium tetrafluoroborate, and a poly glycol.

12 Claims, 7 Drawing Sheets
(7 of 7 Drawing Sheet(s) Filed in Color)

(56) References Cited

OTHER PUBLICATIONS

Kim, S. I. et al., "Dense dislocation arrays embedded in grain boundaries for high-performance bulk thermoelectric, " Science, 348, 109-114 (2015).

Kim, G. H., Shao, L., Zhang, K. & Pipe, "Engineered doping of organic semiconductors for enhanced thermoelectric efficiency," Nature Materials, 12, 719 (2013).

Lee, S. W. et al., "An electrochemical system for efficiently harvesting low-grade heat energy," Nature Communications, 5, 3942 (2014).

Li, T. et al., "Cellulose ionic conductors with high differential thermal voltage for low-grade heat harvesting," Nature Materials, 18, 608 (2019).

Poletayev, A. D., McKay, I. S., Chueh, W. C., Majumdar, A,. "Continuous electrochemical heat engines.," Energy & Environmental Science, 11, 2964-2971 (2018).

Wang, X. et al., "Direct thermal charging cell for converting low-grade heat to electricity," Nature Communications, 10, 1-8 (2019).

Taheri, A., MacFarlane, D. R., Pozo-Gonzalo, C., Pringle, J., "Flexible and non-volatile redox active quasi-solid state ionic liquid based electrolytes for thermal energy harvesting," Sustainable Energy & Fuels, 2, 1806-1812 (2018).

Kim, B. et al., "Robust High Thermoelectric Harvesting Under a Self—Humidifying Bilayer of Metal Organic Framework and Hydrogel Layer," Advanced Functional Materials, 29, 1807549 (2019).

Zhao, D. et al., "Polymer gels with tunable ionic Seebeck coefficient for ultra-sensitive printed thermopiles," Nature Communications, 10, 1093 (2019).

Yang, P. et al., "Wearable thermocells based on gel electrolytes for the utilization of body heat," Angewandte Chemie, 55, 12050-12053 (2016).

Jin, L., Greene, G. W., MacFarlane, D. R. & Pringle, "Redox-active quasi-solid-state electrolytes for thermal energy harvesting," ACS Energy Letters, 1, 654-658 (2016).

Wu, J., Black, J. J. & Aldous, "Thermoelectrochemistry using conventional and novel gelled electrolytes in heat-to-current thermocells," Electrochimica Acta, 225, 482-492 (2017).

Kim, T. et al., "High thermopower of ferri/ferrocyanide redox couple in organic-water solutions," Nano Energy, 31, 160-167 (2017).

Duan, J. et al., "Aqueous thermogalvanic cells with a high Seebeck coefficient for low-grade heat harvest," Nature Communications, 9, 5146 (2018).

Bonetti, M., Nakamae, S., Roger, M. & Guenoun, "Huge Seebeck coefficients in nonaqueous electrolytes, " The Journal of Chemical Physics, 134, 114513 (2011).

Taheri, A., MacFarlane, D. R., Pozo—Gonzalo, C. & Pringle, "Quasi-solid-State Electrolytes for Low-Grade Thermal Energy Harvesting using a Cobalt Redox Couple," ChemSusChem, 11, 2788-2796 (2018).

Kim, S. L., Lin, H. T. & Yu, "Thermally Chargeable Solid—State Supercapacitor," Advanced Energy Materials, 6, 1600546, 7 pages (2016).

Zhao, D. et al.,"Ionic thermoelectric supercapacitors," Royal Society of Chemistry, 9, 1450-1457 (2016).

Sun, J.-Y. et al., "Highly stretchable and tough hydrogels." Nature, 489, 133 (2012).

Zheng, Y.-Z et al., "A combination of FTIR and DFT to study the microscopic structure and hydrogen-bonding interaction properties of the [BMIM][BF4] and water," Molecular and Biomolecular Spectroscopy, 226, 117624 (2020).

Quickenden, T. and Mua, "A review of power generation in aqueous thermogalvanic cells," The Electrochemical Society, 142, 3985-3994 (1995).

Dietzel, M. & Hardt, Thermoelectricity in confined liquid electrolytes, Physical Review Letters, 116, 225901, 5 pages (2016).

Wijeratne, K., Conducting Polymer Electrodes for Thermogalvanic Cells, vol. 1971 (Linköping University Electronic Press, 2019), 113 pages.

Janssen, M. & Bier, "Transient response of an electrolyte to a thermal quench," Physical Review, 99, 042136 (2019).

Cheng, H., He, X., Fan, Z. & Ouyang, "Flexible Quasi-Solid State Ionogels with Remarkable Seebeck Coefficient and High Thermoelectric Properties," Advanced Energy Materials, 9, 1901085 (2019).

Widegren, J. A., Saurer, E. M., Marsh, K. N. & Magee, "Electrolytic conductivity of four imidazolium-based room-temperature ionic liquids and the effect of a water impurity," J. Chem. Thermodynamics, 37, 569-575 (2005).

Yusof, Y., Shukur, M., Hamsan, M., Jumbri, K. & Kadir, "Plasticized solid polymer electrolyte based on natural polymer blend incorporated with lithium perchlorate for electrical double-layer capacitor fabrication," Ionics, 25, 5473-5484 (2019).

Fritzsche, "A general expression for the thermoelectric power," Solid State Communications, 9, 1813-1815(1971).

Xie, X. et al., Thermal conductivity, heat capacity, and elastic constants of water-soluble polymers and polymer blends, Macromolecules, 49, 972-978 (2016).

Saihara, K., Yoshimura, Y., Ohta, S. & Shimizu, "A. Properties of water confined in ionic liquids," Scientific Reports, 5, 10619 (2015).

Hayamizu, K., Aihara, Y., Nakagawa, H., Nukuda, T. and Price, "Ionic conduction and ion diffusion in binary room-temperature ionic liquids composed of [emim][BF4] and LiBF4," J. Phys. Chem. B, 108, 19527-19532 (2004).

Cohen, Y., Avram, L. & Frish, Diffusion NMR spectroscopy in supramolecular and combinatorial chemistry: an old parameter—new insights, Angew. Chem. Int. Ed., 44, 520-554 (2005).

Heimer, et al., Vibrational spectra of imidazolium tetrafluoroborate ionic liquids, Journal of Molecular Liquids, 124 (2006) 84-95.

Amoli, V. et al., "A bioinspired hydrogen bond-triggered ultrasensitive ionic mechanoreceptor skin," Nature Communications, 10, 1-13 (2019).

Yamada, T. & Mizuno, M. J. A. O. Characteristic Spectroscopic Features because of Cation-Anion Interactions Observed in the 700-950 cm-1 Range of Infrared Spectroscopy for Various Imidazolium-Based Ionic Liquids, ACS Omega, 3, 8027-8035 (2018).

Yamada, T. & Mizuno, "Characteristic Spectroscopic Features because of Cation-Anion Interactions Observed in the 700-950 cm-1 Range of Infrared Spectroscopy for Various Imidazolium-Based Ionic Liquids," Soft Matter, 3, 8027-8035 (2018).

Savoie, B. M., Webb, M. A. & Miller III, Enhancing cation diffusion and suppressing anion diffusion via Lewis-acidic polymer electrolytes, The Journal of Physical Chemistry Letters, 8, 641-646 (2017).

Lee, H.-N., Newell, N., Bai, Z. & Lodge, "Unusual lower critical solution temperature phase behavior of poly (ethylene oxide) in ionic liquids," Macromolecules, 45, 3627-3633 (2012).

Siddique, A. R. M., Mahmud, S., Van Heyst, "Reviews, S. E. A review of the state of the science on wearable thermoelectric power generators (TEGs) and their existing challenges," Renewable and Sustainable Energy Reviews, 73, 730-744 (2017).

Park, H. et al., High power output based on watch-strap-shaped body heat harvester using bulk thermoelectric materials, Energy, 187, 115935 (2019).

Dal Poggetto, G., Favaro, D. C., Nilsson, M., Morris, G. A. & Tormena, "9F DOSY NMR analysis for spin systems with $n_{JFF}$ couplings," Magn. Reson. Chem., 52, 172-177 (2014).

T.J. Abraham, D.R. MacFarlane and J.M. Pringle, "High Seebeck coefficient redox ionic liquid electrolytes for thermal energy harvesting," Energy & Environmental Science, 2013, 6, 2639.

D. Zhao, H. Wang, Z. U. Khan, J. C. Chen, R. Gabrielsson, M. P. Jonsson, M. Berggren and X. Crispin, "Ionic thermoelectric supercapacitors," Energy Environ. Sci., 2016, 9, 1450.

T. Li, X. Zhang and L. B. Hu et al., "Cellulose ionic conductors with high differential thermal voltage for low-grade heat harvesting," Nat. Mater., 2019, 18, 608-613.

* cited by examiner

STRETCHABLE IONIC HYDROGEL WITH HIGH THERMOPOWER FOR LOW-GRADE HEAT HARVESTING

CROSS REFERENCE TO RELATED APPLICATION

The present application claims the benefit of priority under 35 U.S.C. Section 119(e) of U.S. Application Ser. No. 63/017,066, filed Apr. 29, 2020, which is hereby incorporated by reference in its entirety.

TECHNICAL FIELD

Disclosed are ionic thermoelectric hydrogels that converts heat into electricity, and devices and methods incorporating the ionic thermoelectric hydrogel.

BACKGROUND

Low-grade heat (<100° C.) is ubiquitous from primary power generation to data centers and even human bodies. Conversion of low-grade heat into electricity provides access to an appealing energy source that is abundant, inexpensive, sustainable and environmentally friendly. Thermoelectric generators (TEs) inclusive of inorganic semiconductors and organic conducting polymers can harvest this energy relying on the Seebeck effect in which electrons migrate in response to temperature difference. Problematically, the highest Seebeck coefficients are found in bismuth antimony telluride of +250 $\mu V\ K^{-1}$ as well as dimethylsulphoxide and ethylene glycol-modified poly(3,4-ethylenedioxythiophene)-poly(styrenesulphonate) (PEDOT:PSS) polymer of +72 $\mu V\ K^{-1}$, which produce very small output voltages over a limited temperature range so that heretofore they had no practical use unless thousands of TEs were integrated into a unit.

"Ions" have the potential to complement "electrons", and the thermogalvanic effect and the Soret effect are utilized in ionic thermoelectric systems. By virtue of temperature-dependent redox reactions, direct thermal charging cells (DTCCs) deliver a thermopower of +5 mV $K^{-1}$ in an aqueous system, and thermo-electrochemical cells (TECs) yield the thermopower of +1.8 mV $K^{-1}$ in a quasi-solid-state system. In contrast, the regulation of ion flux through Soret effect is generally superior in generating high thermopower. A record-high thermopower of +24 mV $K^{-1}$ is attained in a poly(ethyleneoxide)-sodium hydroxide (PEO-NaOH) aqueous solution with a cellulosic membrane to facilitate $Na^+$ transport. Likewise, the PEDOT:PSS polymer film doped with poly(4-styrenesulfonic acid) (PSSH) selectively promotes protons ($H^+$) transport and reaches a thermopower of +16.2 mV $K^{-1}$. Attempts to exploit high thermopower based on the Soret effect of n-type charge carriers, i.e., anions, have been rare since typical cations (e.g., $H^+$ and $Na^+$) adopted to ionic thermoelectric systems move easier than anions (e.g., $PSS^-$ and $OH^-$) under a temperature gradient.

SUMMARY OF THE INVENTION

The following presents a simplified summary of the invention in order to provide a basic understanding of some of its aspects. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

Low-grade heat (<100° C.) is ubiquitous in industrial processes, the environment, Internet of Things (IoT) terminals and even human bodies. However, there is a great challenge in technology in converting material level of the energy of low-grade heat to electricity. Up to now, commonly used thermoelectric generators (TEGs) inclusive of inorganic semiconductors and organic conducting polymers can harvest heat energy based on the Seebeck effect but with small efficiencies and low thermopower. Described herein is a stretchable ionic thermoelectric (i-TE) hydrogel for converting heat into electricity with a huge thermopower and mechanical flexibility. This novel heat to electricity energy conversion technology provides new guidance for thermal energy harvesting and opens up a new direction for self-powered IoT terminals, wearable devices and e-skins.

In order to accomplish the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF SUMMARY OF THE DRAWINGS

This patent or application file contains at least one drawing executed in color. Copies of this patent or patent application publication with color drawing(s) will be provided by the Office upon request and payment of the necessary fee.

FIG. 1A is a graphical illustration of the thermopower of Pam-alginate/EmimBF$_4$/PEG and some of the best reported ionic thermoelectric materials including positive thermopower (green columnar): poly(vinyl alcohol) (PVA)-$Fe^{2+}/Fe^{3+}$ gel,[8] poly (vinylidene fluoride) (PVDF)/Co(bpy)$_3^{2+/3+}$-C$_2$mimNTf$_2$ gel,[4] poly(styrene sulfonic acid) (PSSH) film,[15] poly(vinylidene fluoride-cohexafluoropropylene)/1-ethyl-3-methylimidazolium bis(trifluoromethylsulfony)imide (PVDF-HFP)/EmimTFSI gel,[7] PSSH-PEDOT:PSS film,[6] $Fe^{2+/3+}$ redox couple aqueous solution,[3] polyethylene oxide (PEO)-NaOH solution,[16] NaOH solution with cellulose membrane;[5] negative thermopower (blue columnar): $Fe(CN)_6^{3-}/Fe(CN)_6^{4-}$-urea/GdmCl aqueous solution,[12] $Fe(CN)_6^{3-}/Fe(CN)_6^{4-}$-methanol solution,[11] tetrabutyl ammonium nitrate (TBAN)-dodecanol organic solution,[13] PVA-$Fe(CN)_6^{3-}/Fe(CN)_6^{4-}$ gel,[8] $Fe(CN)_6^{3-}/Fe(CN)_6^{4-}$-cellulose membrane,[9] $Fe(CN)_6^{3-}/Fe(CN)_6^{4-}$-sodium polyacrylate gel,[10] PVDF-HFP/EmimTFSI gel;[7] and our work (red columnar)

FIG. 2 depicts the thermoelectric performance and material characterization of Pam-alginate/EmimBF$_4$/PEG.

FIG. 3 shows aspects of the regulation of ion transport in Pam-alginate/EmimBF$_4$/PEG.

FIG. 4 shows aspects of device cyclability and thermoelectric wristband demonstration; FIG. 4E1-4E4 are infrared images captured at different times indicated with grey dashed box in FIG. 4D.

DETAILED DESCRIPTION

A vast amount of low-grade heat (<100° C.) exists in many places like the environment and human bodies and is usually wasted without use. Low-grade waste heat is projected to be one of the most sustainable and clean potential energy sources for powering IoT terminals and wearable devices. Efficient conversion of the low-grade heat to electricity is challenging for thermoelectric device due to the low temperature differential and small thermopower. Unlike traditional TE devices with thermopower around hundreds of μV K$^{-1}$, the ionic thermoelectric (i-TE) hydrogel of the present invention can simply achieve a large thermopower with tens of mV K$^{-1}$. This approach will be especially attractive for electricity generation by environment temperature, the human body or self-powered wearable/flexible electronics. This i-TE hydrogel can discharge in a capacitance mode with constant current under a temperature difference. Moreover, the i-TE hydrogel has excellent stretchability and moldability which is suitable for wearable and IoT applications.

The ionic thermoelectric (i-TE) hydrogel that converts heat into electricity based on the Soret effect makes use of the low temperature difference of low-grade heat. The material is based on the new quasi-solid hydrogel matrix which exhibits good stretchability and moldability. A combination of thermal energy harvesting (hydrogel-based ion thermal diffusion) and discharge (constant current mode) is employed.

Ionic thermoelectric materials show promise in providing high thermopower in low-grade heat region compared with electronic thermoelectrics. The current ionic thermoelectric materials relying on the thermogalvanic effect or Soret effect can achieve a positive thermopower up to 24 mV K$^{-1}$ yet the small negative thermopower limits the design of ionic thermopiles. The new ionic thermoelectric material of the present invention, which uses poly(acrylamide) and alginate (Pam-alginate) hybrid hydrogel integrated with 1-ethyl-3-methylimidazolium tetrafluoroborate (EmimBF$_4$) and polyethylene glycol (PEG), reaches a high thermopower of −14.26 mV K$^{-1}$. The Pam-alginate/EmimBF$_4$/PEG equipped with excellent stretchability and moldability is suitable for wearable applications and an ionic thermoelectric wristband is showcased. This work opens a platform to regulate the diffusion behaviors of ionic liquids in the hydrogel by selecting anions/cations and taming ion transport with the aid of a hydrogel matrix and polymer chain for pursuing large amounts of thermopower.

As an important complement to ionic thermoelectric technology, negative thermopower is appealing for the mechanistic insights into thermo-diffusion of ions and for the practical deployment and integration of "n-type" and "p-type" ionic thermopiles. In addition to thermopower, the flexibility and compact size of devices are essential for many practical applications, which however are infeasible in aqueous systems. Quasi-solid-state thermoelectric materials are becoming alternatives to address these challenges and to bring the extra benefits of lower thermal conductivity and thermal convection, thereby breaking through the barriers to enable a wearable power supply and to utilize human body heat.

Figure 1A:
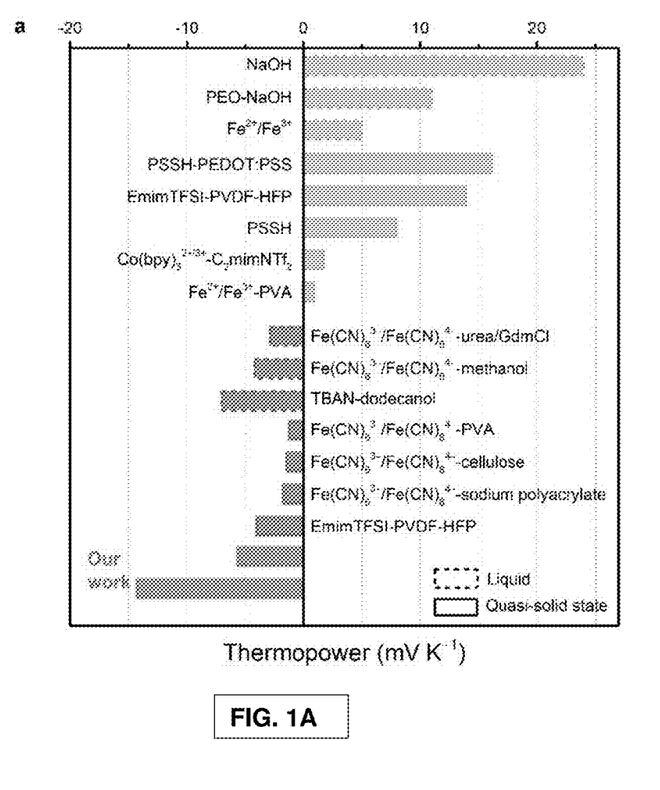
FIG. 1 depicts Pam-alginate/EmimBF$_4$/PEG.

A quasi-solid-state thermoelectric material according to the present invention achieves negative thermopower via pure Soret effect in a hydrogel comprising 1-ethyl-3-methylimidazolium tetrafluoroborate (EmimBF$_4$) ionic liquid and polyethylene glycol (PEG) polymer. The hydrogel is a versatile platform to regulate ion diffusion through internal cross-linking and polymer chains, creating a large difference in ion concentration across the two electrodes. Notably, an ultra-high negative thermopower of −14.26 mV K$^{-1}$ is obtained as compared with all ionic thermoelectric counterparts (FIG. 1a).[6,8,10-20] The highly stretchable ionic hydrogel can be made in a variety of shapes and sizes, and a thermoelectric "wristband" is showcased (FIG. 1B), paving the way for new forms and applications of low-grade heat harvesters.

Thermoelectric Performance

Figure 1B:
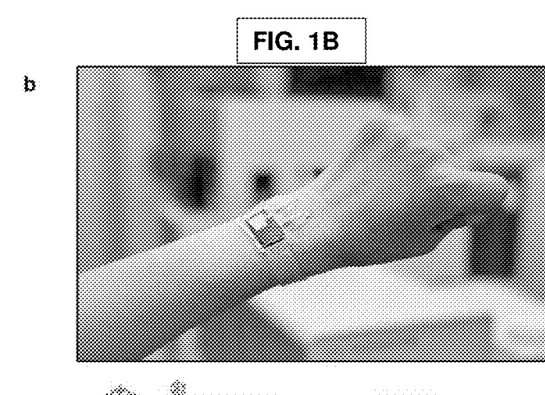
FIG. 1B depicts a digital image of a thermoelectric wristband made of Pam-alginate/EmimBF$_4$/PEG.
Figure 1C:
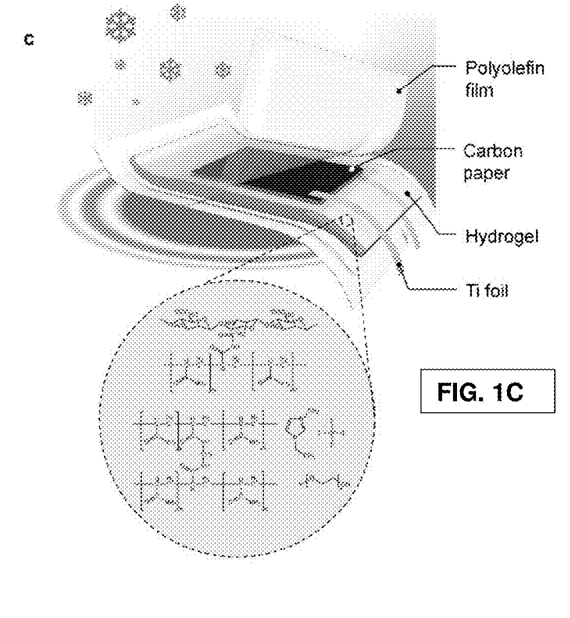
FIG. 1C shows a schematic design of Pam-alginate/EmimBF$_4$/PEG composed of Pam-alginate hybrid hydrogel, EmimBF$_4$ ionic liquid, PEG polymer chain, carbon paper electrodes, Ti foil conductors and polyolefin wrap.

FIG. 1C illustrates our design, which includes a stretchable poly(acrylamide) and alginate (Pam-alginate) hybrid hydrogel containing EmimBF$_4$ ionic liquid and PEG polymer chains, two carbon paper electrodes with titanium leads and a polyolefin wrap for preventing water evaporation from the electrolyte. This device is designated as Pam-alginate/EmimBF$_4$/PEG. The Pam-alginate hybrid hydrogel is chosen as a quasi-solid-state electrolyte matrix since it provides the stretchability for the electrolyte via two covalent cross-links inclusive of the bond through N,N'-methylenebisacrylamide and the bond between amine groups on Pam chains and carboxyl groups on alginate chains.[21] Meanwhile, the Pam-alginate hybrid hydrogel has a water content of 86%, in which two ion species (i.e., $Emim^+$ cation and $BF_4^-$ anion) are completely dissociated and uniformly distributed.[22] When a temperature gradient is applied on the two carbon paper electrodes, $Emim^+$ cations and $BF_4^-$ anions undergo different diffusion behaviors and cause their redistribution in the hydrogel, generating thermovoltage via the Soret effect without the occurrence of interface reactions. The PEG long chains (~30 nm) are introduced into the electrolyte, which not only physically tangle with the hybrid hydrogel matrix, but also selectively impede the movement of Emim+, enlarging the disparity in the thermal diffusion behaviors between Emim+ and $BF_4^-$. The detailed function of PEG will be discussed later.

Figure 2A:
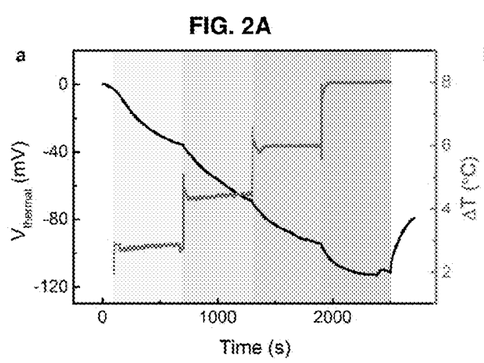
FIG. 2A is a graphical illustration of thermovoltage versus temperature gradient plot.
Figure 2B:
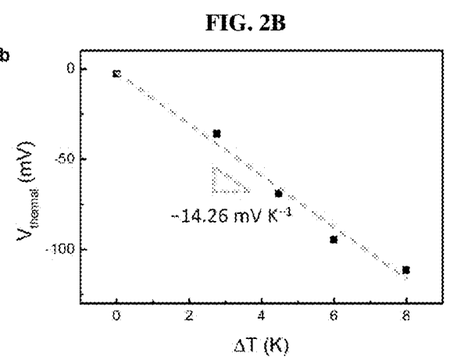
FIG. 2B is a graphical illustration of thermopower of Pam-alginate/EmimBF$_4$/PEG.

Analogous to the Seebeck coefficient (Se) in TEs, the thermopower is denoted as $\alpha_i = V_{thermal}/\Delta T$ for ionic thermoelectric materials, where $V_{thermal}$ is the thermovoltage at a given temperature difference ($\Delta T$).[23] FIG. 2A shows the $V_{thermal}$ versus temperature difference plot of a Pam-alginate/EmimBF$_4$/PEG sample which was subjected to a two-step soaking process in 1.3M EmimBF$_4$ for 16 hours and 0.05 g ml$^{-1}$ ml PEG for 1 hour. (Unless otherwise stated, the treatment of Pam-alginate/EmimBF$_4$/PEG sample was fixed.) The $V_{thermal}$ gradually changes from −2.7 mV to −35.7 mV when a temperature gradient of 2.9° C. is built on two electrodes, and the $V_{thermal}$ further changes to −68.8 mV at a temperature gradient of 4.4° C. and so forth. The thermopower of the Pam-alginate/EmimBF$_4$/PEG sample is calculated to be −14.26 mV K$^{-1}$ (FIG. 2b), surpassing all existing negative-thermopower ionic thermoelectric materials (e.g., TECs, polymer, gels) and providing a negative-Seebeck coefficient TEs.[11-17] The optimization of Pam-alginate/EmimBF$_4$/PEG in terms of EmimBF$_4$ and PEG compositions was studied. Either superfluous EmimBF$_4$ or prolonged soaking of PEG brings about an adverse effect on thermopower generation.

To evaluate the thermoelectric performance with respect to the hydrogel matrix, the control experiments were carried out on pure Pam/EmimBF$_4$, pure alginate/EmimBF$_4$ and pristine Pam-alginate/EmimBF$_4$, exhibiting the thermopower of −2.13 mV K$^{-1}$, −20.7 µV K$^{-1}$, and −5.61 mV K$^{-1}$, respectively. In a binary ionic system, the $V_{thermal}$ is proportional to the difference between the thermophoretic mobilities ($\mu_+ - \mu_-$) for cations and anions, which can be regarded as the disparity between the diffusion coefficients ($D_+ - D_-$) of cations and anions for a monovalent electrolyte.[24] In pure Pam/EmimBF$_4$ with a water content around 90%, the anions move more easily than the cations since the volume of the $BF_4^-$—$H_2O$ complex is smaller than that of the $Emim^+$-$H_2O$ complex.[22] On the other hand, EmimBF$_4$ is difficult to dissociate in pure alginate/EmimBF$_4$ with a water content less than 10% and mainly forms ion pair-water complexes,[22] so that its thermopower is extremely small with the lack of thermal diffusion of dissociated ions. In the absence of PEG, the highest negative thermopower was observed in pristine Pam-alginate/EmimBF$_4$ because the electrostatic attraction of carboxyl group on alginate chains impeded the thermal diffusion of $Emim^+$ cations whereas that of $BF_4^-$ anions through the polymer matrix was facilitated by the electrostatic repulsion of carboxyl group to $BF_4^-$, inducing an enlarged disparity in diffusion coefficients between $Emim^+$ and $BF_4^-$. Additionally, the thermopower was reduced to −1.85 mV K$^{-1}$ when the EmimBF$_4$ ionic liquid was replaced by LiBF$_4$ ionic liquid in pristine Pam-alginate hybrid hydrogel. Likewise, Li$^+$ suffers hindrance from the electrostatic attraction of carboxyl group on the hybrid hydrogel matrix, while the disparity in thermo-diffusion between Li$^+$ cations and $BF_4^-$ anions is compromised since the hydrated Li$^+$ cation is smaller in volume compared with $BF_4^-$—$H_2O$ complex, which overall results in a small negative thermopower. In short, the thermopower originates from the tradeoff between the thermal diffusion of dissociated cations and anions and their interactions with the hydrogel matrix. In another control experiment, the Pam/EmimBF$_4$ modified with PEG reveals a thermopower of −7.96 mV K$^{-1}$, indicating the effectiveness of PEG polymer chains for generating a large negative thermopower.

The thermal charging and electrical discharging behaviors of Pam-alginate/EmimBF$_4$/PEG are shown. The Pam-alginate/EmimBF$_4$/PEG was thermally charged under $\Delta T$~4.5° C. for 600 s and subsequently discharged at 500 nA cm$^{-2}$ for 300 s. It is worth noting that it takes a longer time for Pam-alginate/EmimBF$_4$/PEG to proceed with the thermal charging process under a given thermal bias as compared with TECs in which the thermogalvanic effect with the interfacial electron transfer can occur quickly while ion transport and accumulation via the Soret effect is a relatively sluggish process.[23,28,28]

Material Characterization of Pam-Alginate/EmimBF$_4$/PEG Electrolyte

Figure 2C:
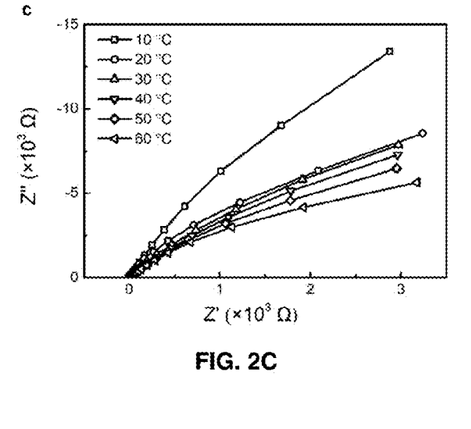
FIG. 2C is a graphical illustration of Nyquist plot of Pam-alginate/ EmimBF$_4$/PEG hydrogel electrolyte at 10-60° C.
Figure 2D:
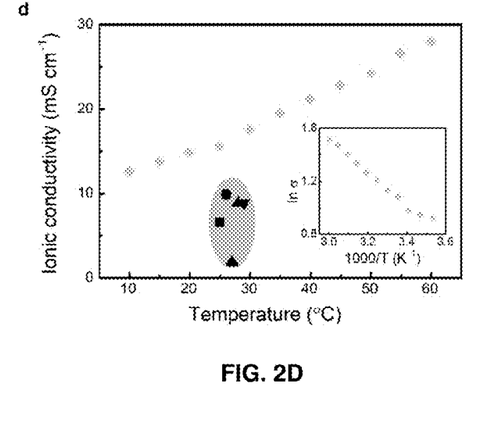
FIG. 2D is a graphical illustration of Ionic conductivity of Pam-alginate/EmimBF$_4$/PEG hydrogel electrolyte as a function of temperature (the inset is with other axis scale). The ionic conductivity of some reported quasi-solid ionic thermoelectric martials (i.e., PVDF-HFP/EmimTFSI gel,[7] PVA-Fe$^{2+/3+}$ gel,[8] PSSH film[15] and PVDF-HFP/1-ethyl-3-methylimidazolium dicyanamide gel[26]) is presented.

The Pam-alginate/EmimBF$_4$/PEG sample was heated uniformly to study its ionic conductivity and activation energy ($E_a$) via electrochemical impedance spectroscopy (EIS). FIG. 2C shows the Nyquist plots and the real part of the impedance at the frequency when the phase angle is closest to 0° is taken to calculate the ionic conductivity. The ionic conductivity of Pam-alginate/EmimBF$_4$/PEG electrolyte increases from 12.5 mS cm$^{-1}$ at 10° C. to 28.0 mS cm$^{-1}$ at 60° C., which is higher than those of polymer gels and ionogels in the previous work (FIG. 2D.[11,12,19,27] The high water content in Pam-alginate hybrid hydrogel not only secures the dissociation of EmimBF$_4$ into $Emim^+$ and $BF_4^-$ but also facilitates the overall ion transport ascribed to a low viscosity background.[28] The increasing trend as a function of temperature is also used to calculate the $E_a$ based on the following equation: $\sigma_T = \sigma_0 e^{-E_a/k_B T}$ where $\sigma$ is the ionic conductivity, $k_B$ is the Boltzmann constant, and $\sigma_0$ is the pre-exponential factor.[6,29] The $E_a$ of Pam-alginate/EmimBF$_4$/PEG is 150 meV, which is higher than the 103 meV of pristine Pam-alginate/EmimBF$_4$. Analogous to $$Se = -\frac{k_B}{e}\left(\frac{E_a}{k_B T} + B\right)$$

in typical thermoelectric semiconductors, where e is the elementary charge and B accounts for charge carrier density in the material,[30] a higher $E_a$ corresponds to a larger Seebeck coefficient (or thermopower). Additionally, the specific capacitance of 100.9 µF cm$^{-2}$-190.6 µF cm$^{-2}$ was retrieved from the Nyquist plots. Moreover, to verify the generation of thermovoltage stemming from the ion diffusion and accumulation, cyclic voltammetry (CV) measurement was conducted at the scan rate from 50 mV s$^{-1}$ to 500 mV s$^{-1}$. The CV profile shows a nearly rectangular shape without redox peaks, indicating a pure capacitive behavior.

Pam-alginate/EmimBF$_4$/PEG hydrogel electrolyte exhibits a thermal conductivity of 0.53 W m$^{-1}$K$^{-1}$ at 25° C. As expected, the thermal conductivity is lower than that in typical aqueous systems (~0.6 W m$^{-1}$K$^{-1}$) owing to the inclusion of water and polymers in the system of the present invention in which the main polymer (e.g., Pam) has a thermal conductivity about 0.38 W m$^{-1}$K$^{-1}$.[31] It was also observed that the thermal conductivity decreased as the temperature increased due to water evaporation in the course of measurement. Low thermal conductivity facilitates the establishment of a thermal gradient across two electrodes. In particular, the hydrogel electrolyte can effectively reduce heat convection which features a low overall heat transfer coefficient compared against aqueous systems for TECs.[12] Differential scanning calorimetry (DSC) measurements were conducted to investigate the thermal behavior of Pam-alginate/EmimBF$_4$/PEG electrolyte in the temperature range of 20° C. to 85° C. Obviously, none of the Pam-alginate, Pam-alginate/EmimBF$_4$, Pam-alginate/EmimBF$_4$/PEG electrolytes has an endothermic peak transition during heating, which rules out the effect of phase change on thermopower generation in our system.

Regulation of Ion Transport

Figure 3A:
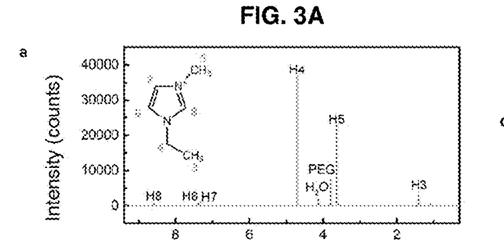
FIG. 3A shows a $^1$H NMR spectrum of Emim$^+$.
Figure 3B:
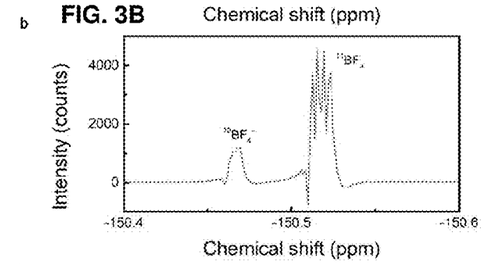
FIG. 3B shows a $^{19}$F NMR spectrum of BF$_4^-$ including the peak assignments.
Figure 3C:
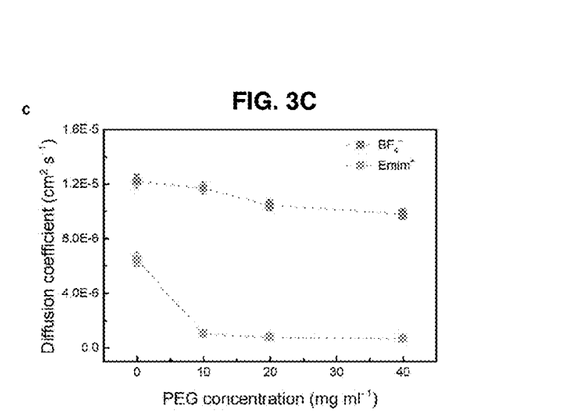
FIG. 3C is a graphical illustration of Diffusion coefficients of Emim$^+$ and BF$_4^-$ in the aqueous solution as a function of PEG concentration.

In Pam-alginate/EmimBF$_4$/PEG, the thermovoltage corresponds to the non-compensated diffusion of Emim$^+$ cations and BF$_4^-$ anions under thermal bias. Apart from the aforementioned effects arising from the nature of Emim+ and BF$_4^-$ ions, the disparity in diffusion behaviors is significantly enlarged by introducing PEG polymer chains. Here, the diffusion of Emim$^+$ and BF$_4^-$ ion species was systematically investigated by using 1D and 2D-diffusion-ordered spectroscopy (DOSY) $^1$H and $^{19}$F nuclear magnetic resonance (NMR). FIG. 3A and FIG. 3B show 1D $^1$H NMR spectrum of Emim+ and $^{19}$F NMR spectrum of BF$_4^-$ with the peak assignments, respectively, where an additional peak of chemical shift at 3.79 ppm is assigned to PEG.[32,33] The pulsed gradient spin echo (PGSE) technique in 2D DOSY NMR for both liquid and hydrogel samples is applied. Supplementary data show $^1$H NMR and $^{19}$F NMR spectra for PGSE experiments of four samples including pure EmimBF$_4$ aqueous solution and EmimBF$_4$ aqueous solutions with three different concentrations of PEG. The signal intensity (I) attenuation in terms of pulse-field gradient strength (G) was used to calculate the diffusion coefficient based on the Stejskal-Tanner equation.[34] FIG. 3C depicts the diffusion coefficient of Emim$^+$ (D$_+$) decreasing from $6.44 \times 10^{-6}$ cm$^2$ s$^{-1}$ to $1.03 \times 10^{-6}$ cm$^2$ s$^{-1}$ in the presence of 10 mg ml$^{-1}$ PEG (84% reduction), which decreases further with increasing PEG concentration. Whereas the diffusion coefficient of BF$_4^-$ (D$_-$) is larger than that of Emim$^+$ at all PEG dosing, which exhibits a mere 4% reduction in response to adding 10 mg ml$^{-1}$ PEG (from $1.22 \times 10^{-5}$ cm$^2$ s$^{-1}$ to $1.17 \times 10^{-5}$ cm$^2$ s$^{-1}$). Especially, the diffusion behavior of Emim$^+$ cations in the hydrogel was studied for the first time, which reveals a drastic reduction of 93%. It is noteworthy that the decrease of D$_+$ in response to adding PEG in the Pam-alginate hybrid hydrogel is larger than that in the aqueous solution as the ion transport of Emim$^+$ cations is further impeded by PEG polymer chains entangling with the hydrogel network. In addition, the in-situ heating was applied to 2D DOSY NMR for EmimBF$_4$ aqueous solution with 10 mg ml$^{-1}$ PEG. Apparently, the D$_-$ increases from $1.17 \times 10^{-5}$ cm$^2$ s$^{-1}$ at 21° C. to $1.73 \times 10^{-5}$ cm$^2$ s$^{-1}$ at 40° C. while the D$_+$ barely increases because Emim$^+$ cations are effectively anchored by PEG.

On the other hand, Supplementary data shows the Raman spectra of Pam, alginate, EmimBF$_4$, and PEG. The Raman spectrum of Pam-alginate/EmimBF$_4$/PEG is characterized by comparing the presence of the absorption bands with the pure components, which is in good agreement with the spectral overlap of all components. Exceptionally, there are two overlapping Raman bands located at 3173 cm$^{-1}$ for pure EmimBF$_4$, which are assigned to ring HCCH symmetric stretching and ring symmetric stretching.[35] Yet, a blue shift to 3178 cm$^{-1}$ is observed in the Raman spectrum of Pam-alginate/EmimBF$_4$/PEG, suggesting the strong confinement of Emim$^+$ on PEG via hydrogen bond.[36-38]

Figure 3D:
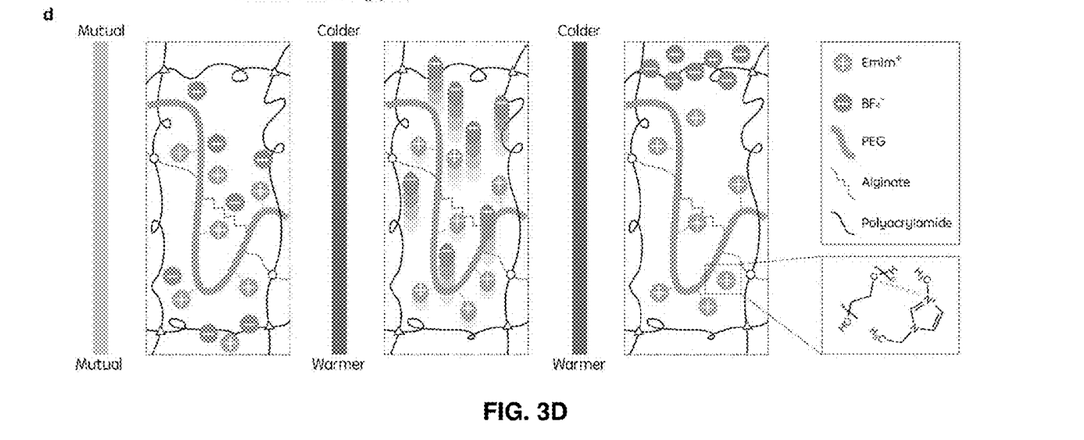
FIG. 3D is a schematic illustration of regulating ion transport (i.e., Emim$^+$ cations and BF$_4^-$ anions) in Pam-alginate/EmimBF$_4$/PEG at a thermal bias via the formation of hydrogen bond with PEG polymer chain.

FIG. 3D schematically illustrates the ion regulation with the aid of the PEG polymer chain in Pam-alginate/EmimBF$_4$/PEG. In the absence of temperature difference, Emim$^+$ cations and BF$_4^-$ anions are completely dissociated and uniformly distributed in the Pam-alginate hybrid hydrogel, where the PEG polymer chains physically tangle with the hydrogel matrix. When a temperature difference is established between the two electrodes, it is easier for BF$_4^-$ anions to move than Emim$^+$ cations because the ion transport of the cation is hindered by the formation of a hydrogen bond with the PEG polymer chain.[39,40] Hence the diffusion of Emim$^+$ cations along the temperature gradient is significantly suppressed, resulting in a desirable disparity between the concentrations of Emim$^+$ and BF$_4^-$ in the hydrogel electrolyte. Thus, a large thermovoltage is generated with overall anions accumulation at the cold electrode.

Device Cyclability and Demonstration

Figure 4A:
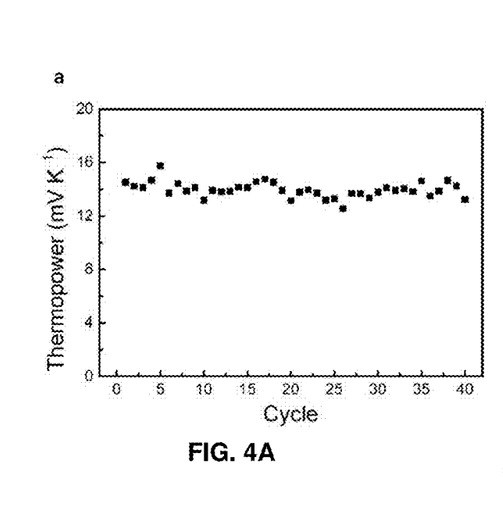
FIG. 4A is a graphical illustration of thermopower of Pam-alginate/EmimBF4/PEG measured in each heating-cooling cycle.
Figure 4B:
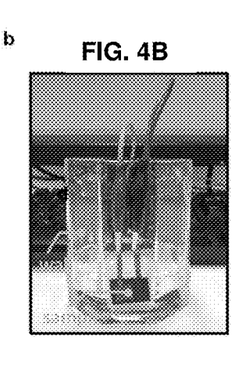
FIG. 4B depicts a digital image of a Pam-alginate/EmimBF4/PEG wristband bound to a glass bottle where the temperature at the wall of the bottle (Twall) and the outside surface of the sample (Tsample) were recorded.

A 40-cycle heating-cooling test was performed on the Pam-alginate/EmimBF$_4$/PEG sample to evaluate its cyclability, which involved a thermal charging process with a temperature gradient of 5° C. and a cooling process at room temperature. The thermopower fluctuation of the Pam-alginate/EmimBF$_4$/PEG sample over 40 cycles is less than 12.8% (FIG. 4A). Such high cyclability not only evidences the reversible temperate-dependent ion transport of Emim$^+$ cations and BF$_4^-$ anions but also makes plain that the internal structure and macro morphology of the hydrogel electrolyte are preserved.

Figure 4C:
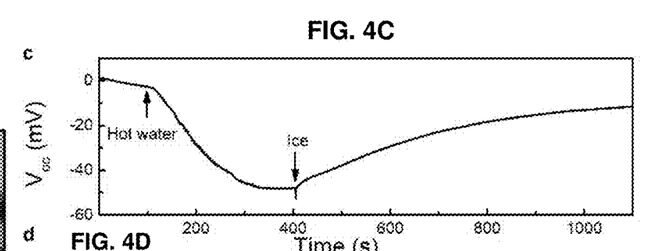
FIG. 4C is a graphical illustration of open-circuit voltage.
Figure 4D:
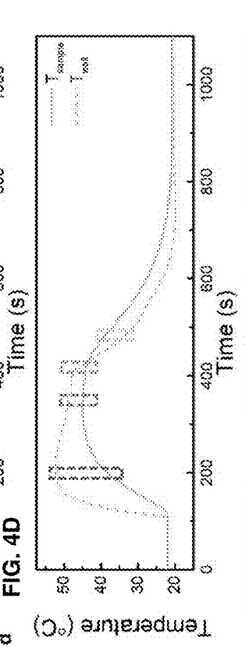
FIG. 4D is a graphical illustration of the changes of temperatures inclusive of Twall and Tsample change with respect to time.
Figure 4E:
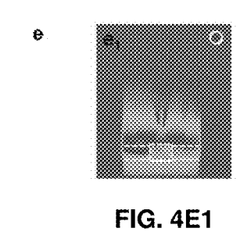
Figure 4E:
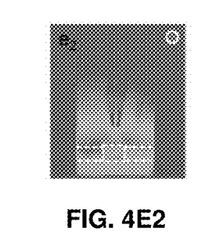
Figure 4E:
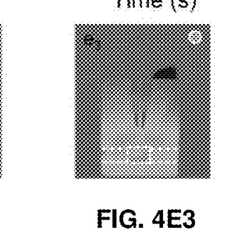
Figure 4E:
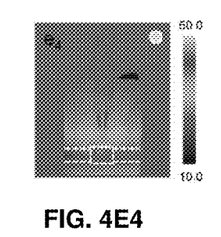

Besides the excellent thermopower and decent cyclability, the Pam-alginate/EmimBF$_4$/PEG device in the form of hydrogel possesses uniqueness and advantages for flexible and wearable power supply technologies as compared with its rigid and liquid counterparts (e.g., TEs and TECs).[41] Notably, the Pam-alginate/EmimBF$_4$/PEG displays a remarkable tensile property in that the hydrogel electrolyte may be stretched up to 20 times of its original length with an elastic modulus of 3.8 kPa. Moreover, the excellent moldability and scalability of Pam-alginate/EmimBF$_4$/PEG enable the manufacture of this ionic thermoelectric material in various shapes and sizes, featuring a device suitable for applications in which it is worn over the skin. A Pam-alginate/EmimBF$_4$/PEG wristband is showcased in FIG. 1B, in which a ring-size sample was stretched several times larger and then fit over the wrist. The thermovoltage with a magnitude of 6.7 mV was generated at a temperature difference around 1° C. when the sample attached to the skin. Even though the theoretical temperature difference could be as high as 8° C. (i.e., skin temperature of 32° C.–ambient temperature of 24° C.), the actual temperature difference for the power output is estimated to be approximately 1° C. due to a large temperature drop at thermal contact and epidermis.[42] A Pam-alginate/EmimBF$_4$/PEG wristband was also demonstrated on a glass bottle (FIG. 4B), in which the hot water and ice were added in turns. FIG. 4C depicts the real-time open-circuit voltage (V$_{oc}$) profile. The temperature of the outer wall of the glass bottle and the outer surface of the sample are denoted as T$_{wall}$ and T$_{sample}$, respectively. When hot water was poured into the glass bottle, both T$_{wall}$ and T$_{sample}$ increased and T$_{wall}$ increased much faster than T$_{sample}$, creating a temperature difference across two electrodes (FIG. 4D). A voltage change from −2.8 mV to −48.0 mV was observed at 400 s with a thermal bias of 3.3° C. After adding ice, T$_{wall}$ and T$_{sample}$ decreased along with the reduction in temperature difference, so the V$_{oc}$ gradually returned until the temperature difference disappeared. The temperature profiles of the glass bottle at four different times were captured by infrared imaging (FIG. 4E1-4E4). As noted, in the Pam-alginate/EmimBF$_4$/PEG wristband, the voltage did not return back to its original value after removing the thermal bias. While not wishing to be bound by theory, it is believed that this phenomenon is an ion transport that occurs along the circular direction instead of unidirectional ion transport across two electrodes.

In summary, an emerging ionic thermoelectric material integrating the Pam-alginate hybrid hydrogel, EmimBF$_4$ ionic liquid and PEG polymer chain is described. Building on the advancement of the hydrogel matrix, the ion diffusion behaviors can be regulated to permit a large disparity between cations and anions. The Pam-alginate/EmimBF$_4$/PEG achieves a record-high negative thermopower of $-14.26$ mV K$^{-1}$ based on mobile BF$_4^-$ anions and immobile Emim$^+$ cations, which overcomes the limitation that cations are usually more easily moved than anions in current ionic thermoelectric systems. The mechanism to constrain Emim$^+$ transport is verified by 2D DOSY $^1$H and $^{19}$F NMR. Additionally, the Pam-alginate/EmimBF$_4$/PEG is equipped with excellent stretchability and moldability, featuring a device suitable for flexible and wearable power supply technologies. The Pam-alginate/EmimBF$_4$/PEG wristband can generate thermovoltage on the skin and a cup of hot water, demonstrating that the Pam-alginate/EmimBF$_4$/PEG is efficient enough to be deployed in different scenarios for low-grade heat harvesting in a reliable and renewable manner. The Pam-alginate/EmimBF$_4$/PEG carries profound implications for the future development of ionic thermoelectric materials including negative and positive thermopower which can be accomplished by taming the ions of diverse ionic liquids. The Pam-alginate/EmimBF$_4$/PEG can be employed for continuous operation by optimizing electrode materials that can undergo redox reactions.[6,7,20]

Figure 5:
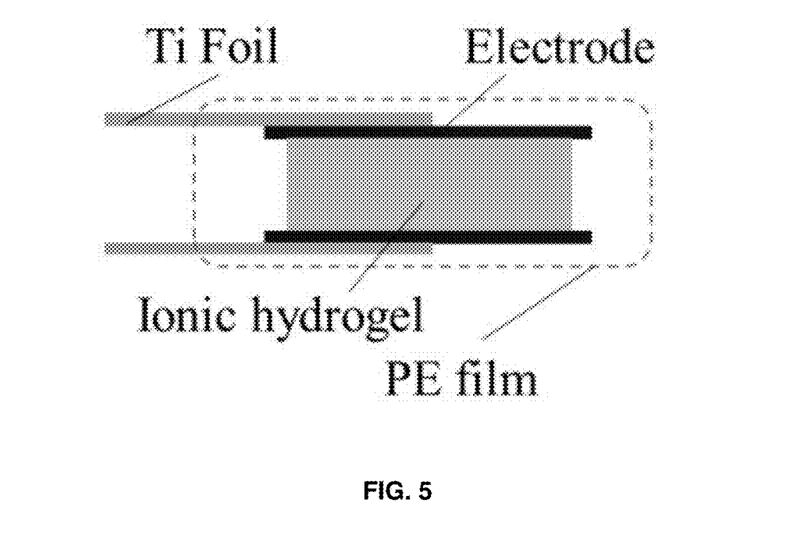
FIG. 5 depicts an ionic hydrogel cell with carbon paper electrodes in accordance with an embodiment.
Figure 6:
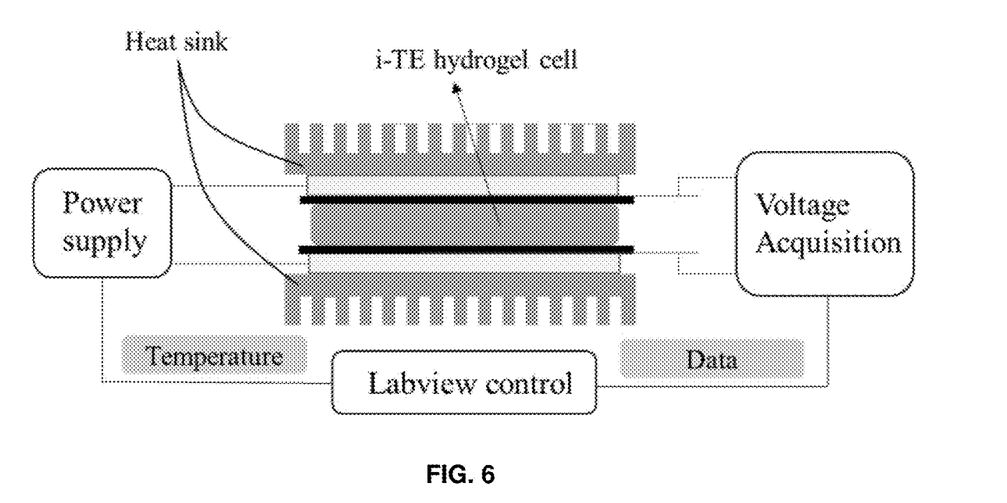
FIG. 6 shows a thermoelectric temperature cycler and thermopower measurements of i-TE cell.

Referring to FIG. 5, an ionic hydrogel cell with carbon paper electrodes is shown. Acrylamide and alginate were dissolved in deionized water at 25° C. to make a homogeneous aqueous solution. APS initiator and BIS cross-linker were then added in. The solution was degassed for 5 minutes in a vacuum chamber prior to being poured into a rectangular glass mold, which was then covered by a glass substrate keeping the air out. The Pam-alginate hybrid hydrogel was cured under ultraviolet illumination for 1.5 hours and then soaked in EmimBF$_4$ ionic liquids with various concentrations (e.g., 1 M, 1.3 M, and 1.5 M) for 16 hours, which was subjected to the second soaking step in PEG aqueous solution (0.05 g ml$^{-1}$) for 1 hour. A two-electrode capacitor-like cell configuration was used in the ionic thermoelectric (i-TE) device (FIG. 5). Two carbon papers were used as the electrodes and covered on the top and bottom of the hydrogel, on which titanium foils were connected for collecting current due to their corrosion resistance and stability at the selected working temperature range. The typical thickness of a cell was 1.5-2.2 mm. To prevent water evaporation from the hydrogel, polyolefin shrink films were utilized to encapsulate the entire device. A homemade thermoelectric-based temperature cycler was used to control heating and cooling using Labview programs. Thermopaste (Omega) was applied to all of the interfaces to ensure good thermal contact (FIG. 6). The electrochemical measurements (e.g. open circuit potential (OCP)) were conducted in Gamry Reference 3000 Potentiostat. That is, FIG. 6 shows a thermoelectric temperature cycler and thermopower measurements of i-TE cell.

Figure 7:
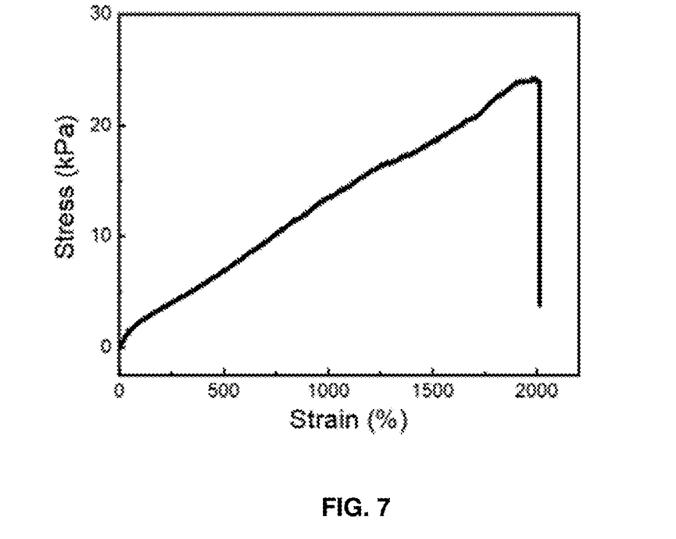
FIG. 7 is a graphical illustration of tensile property of Pam-alginate/EmimBF4/PEG hydrogel.
Figure 8A:
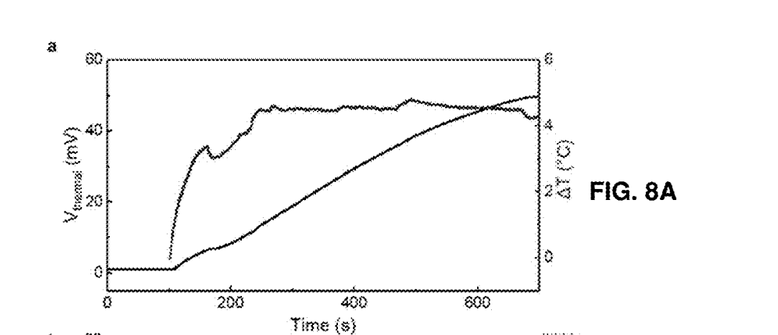
FIG. 8A and FIG. 8B are graphical illustrations of thermally charging and constant current discharging processes of a hydrogel i-TE cell.
Figure 8B:
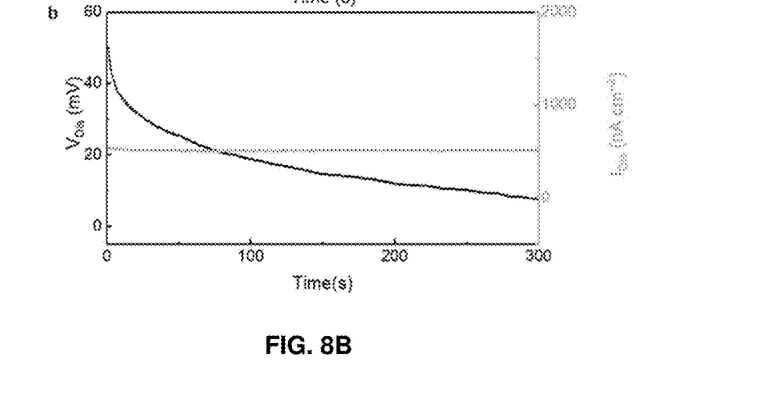

The Pam-alginate/EmimBF4/PEG hydrogel also displays a remarkable tensile property in that the hydrogel electrolyte cab be stretched up to 20 times of its original length with an elastic modulus of 3.8 kPa (FIG. 7). This excellent moldability and scalability of Pam-alginate/EmimBF4/PEG enables the manufacture of this ionic thermoelectric material in various shapes and sizes, featuring a device suitable for over the skin applications.

Figure 9:
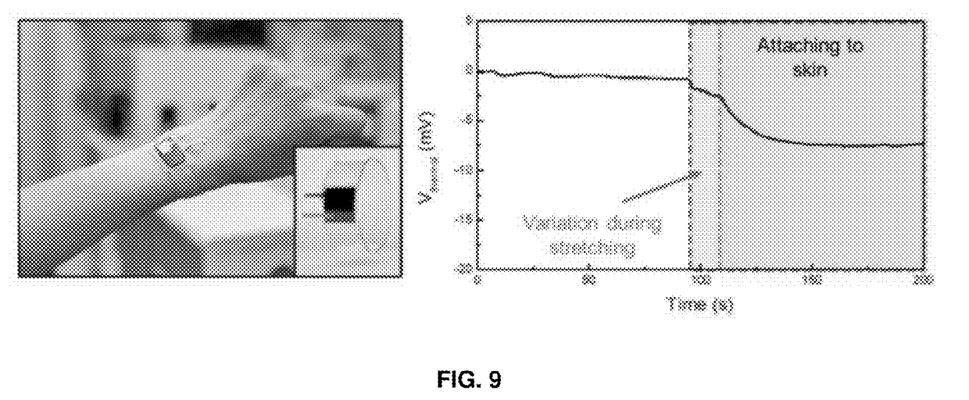
FIG. 9 depicts an i-TE wristband demonstration and a graphical illustration of a thermal voltage response.

FIG. 6A and FIG. 6B displays that the Pam-alginate/EmimBF4/PEG was thermally charged at a nearly 4° C. temperature difference for 10 minutes and then discharge at a constant current of 500 nA cm$^{-2}$. Besides, FIG. 9 shows the wristband demonstration using the Pam-alginate/EmimBF4/PEG to convert heat into electricity at room temperature using a small temperature difference from human body heat. The generated thermal voltage exhibits a fast temperature response. By applying a small temperature difference of ~1° C. from human body heat, the thermoelectric wristband produces ~10 mV thermal voltage. The i-TE hydrogel reveals the largest n-type (negative response to temperature difference) thermopower known to date. Moreover, this i-TE hydrogel shows a large application value as wearable devices and e-skins because of the nature of its robustness, excellent mechanical flexibility and moldability.

The underlying mechanism is related to the ion thermal diffusion process under temperature gradient based on the Soret effect which leads to charge separation and ion accumulation. Ionic liquids dissolved in H$_2$O solvent according to the present invention provide ionized cations and anions in the system. In our case of Pam-alginate/EmimBF$_4$/PEG, diffusion behaviors of anions and cations are different along the temperature gradient. Because the cations in ionic hydrogel are hindered by the formation of hydrogen bonds with PEG polymer chains and Pam-alginate hydrogel matrix, the transport of cations is suppressed. Hence a desirable disparity between the concentrations of cations and anions is established and a large amount of thermopower is generated with an overall anion accumulation at the cold side.

Thermally charging of a hydrogel i-TE cell at a low temperature difference suggests the potential for using electrochemical systems in powering wearable devices and flexible electronics at the room temperature range. As low grade heat is abundantly available in industrial processes, environment, biological entities, solar-thermal energy, and human body, the disclosure herein opens up a guidance on self-powered electronics and regulate the diffusion behaviors of ionic liquids in the hydrogel by selecting anions/cations and taming ion transport with the aid of hydrogel matrix and polymer chain for pursuing a large amount of thermopower.

The devices and methods herein present a new quasi-solid-state hydrogel based i-TE generator to convert heat to electricity, which can provide a large amount of thermopower and great device flexibility for heat harvesting applications. Moreover, it is more cost-effective in low-grade heat regimes as compared to the current available technology, such as traditional semiconductor thermoelectric generators like $Bi_2Te_3$ bulk material.

The devices and methods herein show a large and fast/sensitive response to the temperature variation, which has potential for different kinds of IoT temperature sensors. In addition, the capacitor-like continuous discharging phenomenon under temperature gradient is applicable to the development of a rechargeable device which can directly harvest waste heat energy in the environment.

Wearable devices, flexible electronics and Internet of Things (IoT) are developing rapidly. The energy supply and battery replacements for these devices will be an issue in their development process. As low-grade heat is abundantly available in industrial processes, the environment, biological entities, solar-thermal energy, and the human body, the devices and methods herein can lead to development and practical deployment of thermal-charging i-TE devices for self-powered wearable devices and flexible electronics. The devices and methods herein provide a platform that regulates the diffusion behaviors of ionic liquids in the hydrogel by selecting anions/cations and taming ion transport with the aid of hydrogel matrix and polymer chain for pursuing a large amount of thermopower.

It is demonstrated herein that the hydrogel based i-TE cell has a large amount of thermopower and good capacity. It has a strong and fast/sensitive voltage response to the temperature gradient, and is capable of smoothly discharging under temperature difference. This clearly demonstrates the huge potential for a sustainable method of harvesting waste heat energy.

Because of the large thermopower generated by this i-TE hydrogel, one utility is to use human body heat (small temperature gradient between the environment and the human skin) as a heat source to power wearable devices and some IoT sensors which can work with small power.

Examples

Materials

Acrylamide (99%, Sigma-Aldrich) monomer, N,N'-methylenebisacrylamide (BIS, 99%, Sigma-Aldrich) cross-linker, ammonium persulfate (APS, ≥98%, Sigma-Aldrich) initiator, sodium alginate (Sigma-Aldrich), 1-ethyl-3-methylimidazolium tetrafluoroborate (EmimBF$_4$, ≥99%, Sigma-Aldrich), and polyethylene glycol (Mw=6000 Da, Sigma-Aldrich) can be used in practicing the present invention without further purification. Deionized water (18.2 MΩ) was used throughout the experiments.

Preparation of Ionic Thermoelectric Hydrogel 12.2 g acrylamide and 1.22 g alginate were dissolved in deionized water at 25° C. to make a 100 ml homogeneous aqueous solution. A 2.19×10$^{-5}$ mol APS initiator and 4.67×10$^{-5}$ mol BIS cross-linker were added. The solution was degassed for 5 minutes in a vacuum chamber prior to being poured into a rectangular glass mold or a 3D-printing circular mold, which was then covered by a glass substrate. The Pam-alginate hybrid hydrogel was cured under ultraviolet illumination for 1.5 hours and then soaked in EmimBF$_4$ ionic liquids with various concentrations (e.g., 1 M, 1.3 M, and 1.5 M) for 16 hours, which was subjected to a second soaking step in PEG aqueous solution (0.05 g ml$^{-1}$) for 1 hour.

Device Fabrications

The liquid on the surface of the Pam-alginate/EmimBF$_4$/PEG hydrogel electrolyte was dried using the N$_2$ stream. Two carbon papers (resistance 1.89 mΩ cm$^{-2}$) were used as the electrodes and covered on the top and bottom of the hydrogel, on which titanium foils were connected for collecting current due to their corrosion resistance and stability at our working temperature range. The thickness of the device is basically determined by the thickness of Pam-alginate/EmimBF$_4$/PEG hydrogel electrolyte. To prevent water evaporation from the hydrogel, polyolefin shrink films were utilized to encapsulate the entire device. Exceptionally, the "wristband" sample was sealed by polyolefin film partially for better fitting with the user's wrists (see Figs.).

Characterization

Liquid phase 1D and 2D-diffusion-ordered spectroscopy (DOSY) $^1$H and $^{19}$F nuclear magnetic resonance (NMR) experiments were performed on a 9.4 Tesla Bruker Advance III 400 MHz NMR spectrometer equipped with a 5 mm $^1$H/$^{19}$F BBFO SmartProbe, and a Diff30 probe-head with a selective RF-inset was used. A 20 mg ml$^{-1}$ EmimBF$_4$ aqueous solution and EmimBF$_4$ aqueous solutions with PEG at various concentrations (i.e., 10 mg ml$^{-1}$, 20 mg ml$^{-1}$ and 40 mg ml$^{-1}$) were prepared in 0.5 ml D$_2$O. Stimulated echo bipolar gradient pulses with 2 spoil gradients were run in pseudo 2D mode with 32 increments for 2D-DOSY $^1$H and $^{19}$F NMR, operating at 400.1 and 376.45 MHz for $^1$H and $^{19}$F, respectively.[43]

The in-situ heating DOSY $^1$H and $^{19}$F NMR experiments were carried out at three different temperatures (i.e., 21° C., 30° C. and 40° C.) using a digital variable temperature unit (B-VT 3000).

$^1$H DOSY NMR for hydrogel was conducted on a Bruker Avance III 500 spectrometer equipped with a 4 mm $^1$H resonance (HR) magic-angle spinning (MAS) probe head operating at 500 MHz $^1$H Larmor frequency. The Pam-alginate hydrogel samples were prepared directly in the NMR tubes and the water content was from the mixture of H$_2$O/D$_2$O (9:1, v/v). The temperature was controlled at 21° C. for 15 minutes prior to the measurement.

The diffusion coefficient (D) is characterized based on the Stejskal-Tanner equation,[34]

$$\ln\left(\frac{I_G}{I_0}\right) = -\gamma^2 G^2 \delta^2 (\Delta - \delta/3) D = -ZD \tag{2}$$

$$Z = \gamma^2 G^2 \delta^2 (\Delta - \delta/3) \tag{3}$$

where G is the pulse-field gradient strength, Δ is the time separation between pulsed-gradients, δ is the duration of the pulses and γ is the gyromagnetic ratio. The $I_G$ and $I_0$ are the signal intensity at G and G=0, respectively, and the product $\gamma^2 G^2 \delta^2 (\Delta-\delta/3)$ is termed the Zvalue. All specific parameters were adopted to DOSY $^1$H and $^{19}$F NMR measurements.

Raman spectra were obtained in the range of 200-4000 cm$^{-1}$ using a confocal Raman microscope (LabRAM HR Evolution, Horiba) equipped with a diode-pump solid-state (DSPP) laser (532 nm) and a neutral-density filter (ND filter). The laser was focused using a 50× objective (NA=0.5). The number of gratings in the Raman microscope was 600 groove mm$^{-1}$. The acquisition time of a single Raman spectrum was 8 s. The hydrogel samples were placed in a temperature-control system (Linkam THMS600) to study Raman spectra at different temperatures with an accuracy of ±0.1° C.

Thermal conductivity of Pam-alginate hydrogel with EmimBF$_4$ and PEG was measured using a transient hot-wire method (TC3000 thermal conductivity meter, XIATech). Before each measurement, the temperature was held study for 20 minutes, and the measurement at each temperature was made in triplicate.

Mechanical tests of the hydrogels were conducted in air, at room temperature, using an Instron 3340 single column universal materials test machine equipped with pneumatic clamping. The loading rate was kept at 15 mm min$^{-1}$.

Differential scanning calorimetry (DSC) analysis was performed on a Discovery DSC (TA Instruments) at the temperature range of 20-90° C. with a heating/cooling rate of 10° C. min$^{-1}$ under nitrogen flow.

Electrochemical Measurement

Electrochemical tests were performed using a CHI 660E potentiostat, while electrochemical impedance spectroscopy (EIS) characterization was conducted using Gamry Reference 3000 potentiostat, where the samples were tested under open circuit condition with a voltage amplitude of 5 mV in the frequency range of $10$-$10^6$ Hz. The ionic conductivity at different temperatures was calculated from $\sigma=t/RA$, where R is retrieved at the frequency when the phase angle is closest to 0°, L is the distance between two carbon electrodes and A is the area of the electrodes. During the experiments, heating and cooling were carried out using processes upon two electrodes by employing two thermoelectric modules, and the temperature was recorded and controlled by two thermocouples and a Labview program.[8]

The cited references in this application are incorporated herein by reference in their entirety and are as follows:

1. Poudel, B. et al. High-thermoelectric performance of nanostructured bismuth antimony telluride bulk alloys. 320, 634-638 (2008).
2. Kraemer, D. et al. High-performance flat-panel solar thermoelectric generators with high thermal concentration. 10, 532 (2011).
3. Kim, S. I. et al. Dense dislocation arrays embedded in grain boundaries for high-performance bulk thermoelectrics. 348, 109-114 (2015).
4. Kim, G. H., Shao, L., Zhang, K. & Pipe, K. P. J. N. m. Engineered doping of organic semiconductors for enhanced thermoelectric efficiency. 12, 719 (2013).
5. Lee, S. W. et al. An electrochemical system for efficiently harvesting low-grade heat energy. 5, 3942 (2014).
6. Li, T. et al. Cellulose ionic conductors with high differential thermal voltage for low-grade heat harvesting. 18, 608 (2019).
7. Poletayev, A. D., McKay, I. S., Chueh, W. C., Majumdar, A. J. E. & Science, E. Continuous electrochemical heat engines. 11, 2964-2971 (2018).
8. Wang, X. et al. Direct thermal charging cell for converting low-grade heat to electricity. 10, 1-8 (2019).
9. Taheri, A., MacFarlane, D. R., Pozo-Gonzalo, C., Pringle, J. M. J. S. E. & Fuels. Flexible and non-volatile redox active quasi-solid state ionic liquid based electrolytes for thermal energy harvesting. 2, 1806-1812 (2018).
10. Kim, B. et al. Robust High Thermoelectric Harvesting Under a Self-Humidifying Bilayer of Metal Organic Framework and Hydrogel Layer. 29, 1807549 (2019).
11. Zhao, D. et al. Polymer gels with tunable ionic Seebeck coefficient for ultra-sensitive printed thermopiles. 10, 1093 (2019).
12. Yang, P. et al. Wearable thermocells based on gel electrolytes for the utilization of body heat. 55, 12050-12053 (2016).
13. Jin, L., Greene, G. W., MacFarlane, D. R. & Pringle, J. M. J. A. E. L. Redox-active quasi-solid-state electrolytes for thermal energy harvesting. 1, 654-658 (2016).
14. Wu, J., Black, J. J. & Aldous, L. J. E. A. Thermoelectrochemistry using conventional and novel gelled electrolytes in heat-to-current thermocells. 225, 482-492 (2017).
15. Kim, T. et al. High thermopower of ferri/ferrocyanide redox couple in organic-water solutions. 31, 160-167 (2017).
16. Duan, J. et al. Aqueous thermogalvanic cells with a high Seebeck coefficient for low-grade heat harvest. 9, 5146 (2018).
17. Bonetti, M., Nakamae, S., Roger, M. & Guenoun, P. J. T. J. o. c. p. Huge Seebeck coefficients in nonaqueous electrolytes. 134, 114513 (2011).
18. Taheri, A., MacFarlane, D. R., Pozo-Gonzalo, C. & Pringle, J. M. J. C. Quasi-solid-State Electrolytes for Low-Grade Thermal Energy Harvesting using a Cobalt Redox Couple. 11, 2788-2796 (2018).
19. Kim, S. L., Lin, H. T. & Yu, C. J. A. E. M. Thermally Chargeable Solid-State Supercapacitor. 6, 1600546 (2016).
20. Zhao, D. et al. Ionic thermoelectric supercapacitors. 9, 1450-1457 (2016).
21. Sun, J.-Y. et al. Highly stretchable and tough hydrogels. 489, 133 (2012).
22. Zheng, Y.-Z. et al. A combination of FTIR and DFT to study the microscopic structure and hydrogen-bonding interaction properties of the [BMIM][BF4] and water. 226, 117624 (2020).
23. Quickenden, T. & Mua, Y. J. J. o. T. E. S. A review of power generation in aqueous thermogalvanic cells. 142, 3985-3994 (1995).
24. Dietzel, M. & Hardt, S. J. P. r. 1. Thermoelectricity in confined liquid electrolytes. 116, 225901 (2016).
25. Wijeratne, K. Conducting Polymer Electrodes for Thermogalvanic Cells. Vol. 1971 (Linkoping University Electronic Press, 2019).
26. Janssen, M. & Bier, M. J. P. R. E. Transient response of an electrolyte to a thermal quench. 99, 042136 (2019).
27. Cheng, H., He, X., Fan, Z. & Ouyang, J. J. A. E. M. Flexible Quasi-Solid State Ionogels with Remarkable Seebeck Coefficient and High Thermoelectric Properties. 9, 1901085 (2019).
28. Widegren, J. A., Saurer, E. M., Marsh, K. N. & Magee, J. W. J. T. J. o. C. T. Electrolytic conductivity of four imidazolium-based room-temperature ionic liquids and the effect of a water impurity. 37, 569-575 (2005).
29. Yusof, Y., Shukur, M., Hamsan, M., Jumbri, K. & Kadir, M. F. Z. J. I. Plasticized solid polymer electrolyte based on natural polymer blend incorporated with lithium perchlorate for electrical double-layer capacitor fabrication. 25, 5473-5484 (2019).
30. Fritzsche, H. J. S. S. C. A general expression for the thermoelectric power. 9, 1813-1815 (1971).
31. Xie, X. et al. Thermal conductivity, heat capacity, and elastic constants of water-soluble polymers and polymer blends. 49, 972-978 (2016).
32. Saihara, K., Yoshimura, Y., Ohta, S. & Shimizu, A. J. S. r. Properties of water confined in ionic liquids. 5, 10619 (2015).
33. Hayamizu, K., Aihara, Y., Nakagawa, H., Nukuda, T. & Price, W. S. J. T. J. o. P. C. B. Ionic conduction and ion diffusion in binary room-temperature ionic liquids composed of [emim][BF4] and LiBF4. 108, 19527-19532 (2004).
34. Cohen, Y., Avram, L. & Frish, L. J. A. C. I. E. Diffusion NMR spectroscopy in supramolecular and combinatorial chemistry: an old parameter—new insights. 44, 520-554 (2005).
35. Heimer, N. E., Del Sesto, R. E., Meng, Z., Wilkes, J. S. & Carper, W. R. J. J. o. m. l. Vibrational spectra of imidazolium tetrafluoroborate ionic liquids. 124, 84-95 (2006).
36. Amoli, V. et al. A bioinspired hydrogen bond-triggered ultrasensitive ionic mechanoreceptor skin. 10, 1-13 (2019).
37. Yamada, T. & Mizuno, M. J. A. O. Characteristic Spectroscopic Features because of Cation-Anion Interactions Observed in the 700-950 cm-1 Range of Infrared Spectroscopy for Various Imidazolium-Based Ionic Liquids. 3, 8027-8035 (2018).
38. Xiao, Z. et al. Unusual phase separation and rheological behavior of poly (ethylene oxide)/ionic liquid mixtures with specific interactions. 12, 7613-7623 (2016).

39 Savoie, B. M., Webb, M. A. & Miller III, T. F. J. T. j. o. p. c. l. Enhancing cation diffusion and suppressing anion diffusion via Lewis-acidic polymer electrolytes. 8, 641-646 (2017).

40 Lee, H.-N., Newell, N., Bai, Z. & Lodge, T. P. J. M. Unusual lower critical solution temperature phase behavior of poly (ethylene oxide) in ionic liquids. 45, 3627-3633 (2012).

41 Siddique, A. R. M., Mahmud, S., Van Heyst, B. J. R. & Reviews, S. E. A review of the state of the science on wearable thermoelectric power generators (TEGs) and their existing challenges. 73, 730-744 (2017).

42 Park, H. et al. High power output based on watch-strap-shaped body heat harvester using bulk thermoelectric materials. 187, 115935 (2019).

43 Dal Poggetto, G., Favaro, D. C., Nilsson, M., Morris, G. A. & Tormena, C. F. J. M. R. i. C. 19F DOSY NMR analysis for spin systems with nJFF couplings. 52, 172-177 (2014).

Unless otherwise indicated in the examples and elsewhere in the specification and claims, all parts and percentages are by weight, all temperatures are in degrees Centigrade, and pressure is at or near atmospheric pressure.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While the invention is explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An ionic thermoelectric hydrogel (i-TE), comprising:
   poly(acrylamide) (Pam) crosslinked with an alginate;
   1-ethyl-3-methylimidazolium tetrafluoroborate (EmimBF$_4$); and
   a poly glycol.

2. The thermoelectric hydrogel of claim 1 wherein the alginate is an alginate hybrid hydrogel, the 1-ethyl-3-methylimidazolium tetrafluoroborate is an ionic liquid and the poly glycol is a polyethylene glycol (PEG).

3. The thermoelectric hydrogel of claim 1 wherein the hydrogel is a quasi-solid-state thermoelectric material having a negative thermopower of −14.26 mV K$^{-1}$.

4. A device comprising:
   a polyacrylamide (Pam)-alginate integrated with (1-Ethyl-3-methylimidazolium tetrafluoroborate (EmimBF$_4$) and Polyethylene Glycol (PEG) (Pam-alginate/EmimBF$_4$/PEG) material that is stretchable and is formed from a thermoelectric alginate hybrid hydrogel containing EmimBF$_4$ ionic liquid and PEG polymer chains;
   two carbon paper electrodes with titanium leads; and
   a polyolefin wrap for preventing water evaporation from the electrolyte.

5. The device of claim 4, wherein
   the Pam-alginate is a hybrid hydrogel in the form of a quasi-solid-state electrolyte matrix providing stretchability for the electrolyte via two covalent crosslinks inclusive of the bond through N,N'-methylenebisacrylamide and the bond between amine groups on Pam chains and carboxyl groups on alginate chains, and
   the Pam-alginate hybrid hydrogel has a water content of 86%, in which Emim$^+$ cation and BF$_4^-$ anion are completely dissociated and uniformly distributed.

6. The device of claim 5 wherein the Pam-alginate/EmimBF$_4$/PEG material can be stretched up to 20 times of its original length.

7. The device of claim 6 wherein the Pam-alginate/EmimBF$_4$/PEG material has an elastic modulus of up to about 3.8 kPa.

8. The device of claim 5 wherein the Pam-alginate/EmimBF$_4$/PEG material is moldable.

9. An ionic thermoelectric hydrogel cell, comprising:
   an ionic thermoelectric hydrogel comprising a poly(acrylamide) crosslinked with an alginate, 1-ethyl-3-methylimidazolium tetrafluoroborate, and a poly glycol;
   at least two electrodes each at least partially surrounding the ionic thermoelectric hydrogel; and
   a metal lead coupled to each electrode.

10. A method of making an ionic thermoelectric hydrogel cell, comprising the steps of;
    dissolving acrylamide and alginate in deionized water at about 25° C. to make a homogeneous aqueous solution;
    adding an APS initiator and BIS cross-linker to the aqueous solution:
    degassing the aqueous solution for about 5 minutes in a vacuum chamber;
    pouring the degassed aqueous solution into a mold;
    covering the mold with a substrate to keep air out and to form a polyacrylamide-alginate (Pam-alginate) hybrid hydrogel;
    curing the hydrogel under ultraviolet illumination for about 1.5 hours; and
    soaking the cured hydrogel in 1-ethyl-3-methylimidazolium tetrafluoroborate (EmimBF$_4$) ionic liquid for 16 hours; and
    subjecting the cured hydrogel to a second soaking step in polyethylene glycol (PEG) aqueous solution for about 1 hour.

11. The method of making an ionic thermoelectric hydrogel cell according to claim 10 further comprising the steps of
    applying two carbon papers titanium foil to the cured hydrogel as electrodes; and
    covering the top and bottom of the hydrogel.

12. The method of making an ionic thermoelectric hydrogel cell according to claim 11 further comprising the step of encapsulating the entire cell with device polyolefin shrink films to prevent water evaporation from the hydrogel.

* * * * *